United States Patent
Cho et al.

(10) Patent No.: US 8,659,377 B1
(45) Date of Patent: Feb. 25, 2014

(54) MAGNETIC DEVICE USING PERMANENT MAGNETS

(71) Applicant: Korea Atomic Energy Research Institute, Daejeon (KR)

(72) Inventors: Sang-Jin Cho, Daejeon (KR); Shin-Ae Kim, Daejeon (KR); Elena Magay, Daejeon (KR)

(73) Assignee: Korea Atomic Energy Research Institute (KR)

( * ) Notice: Subject to any disclaimer, the term of this patent is extended or adjusted under 35 U.S.C. 154(b) by 0 days.

(21) Appl. No.: 13/910,445

(22) Filed: Jun. 5, 2013

(30) Foreign Application Priority Data

Sep. 20, 2012 (KR) .................. 10-2012-0104305

(51) Int. Cl.
*H01F 7/02* (2006.01)
*H01F 13/00* (2006.01)

(52) U.S. Cl.
CPC ............ *H01F 7/0273* (2013.01); *H01F 7/0278* (2013.01); *H01F 13/00* (2013.01)
USPC .......................................... 335/306; 335/284

(58) Field of Classification Search
CPC ...... H01F 7/0273; H01F 7/0278; H01F 13/00
USPC .................................................. 335/284, 306
See application file for complete search history.

(56) References Cited

U.S. PATENT DOCUMENTS 4,953,555 A * 9/1990 Leupold et al. ............... 600/421
5,034,715 A * 7/1991 Leupold et al. ............... 335/306

FOREIGN PATENT DOCUMENTS

JP  2012076963  4/2012

* cited by examiner

*Primary Examiner* — Ramon Barrera
(74) *Attorney, Agent, or Firm* — Cantor Colburn LLP

(57) ABSTRACT

Provided is a magnetic device using permanent magnets according to an exemplary embodiment of the present invention. In more detail, the present invention relates to a magnetic device using permanent magnets that can form a high magnetic field using a first permanent magnet and a second permanent magnet to perform various kinds of magnetic field application experiments, in particular, can be used for a single crystal growth, generation of polarized neutrons, and the like, and easily manufactured with a simple configuration and secure sufficient durability.

13 Claims, 19 Drawing Sheets

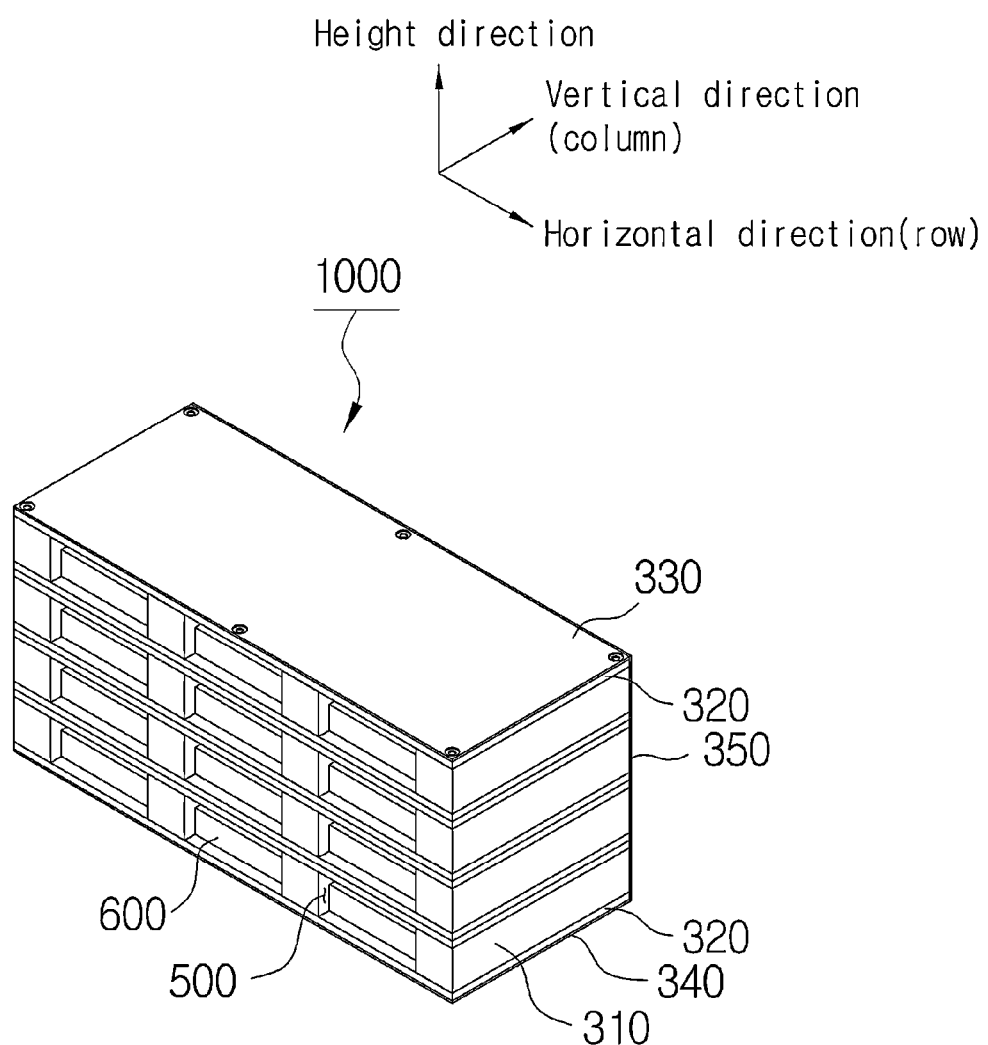

MAGNETIC DEVICE USING PERMANENT MAGNETS

CROSS-REFERENCE TO RELATED APPLICATIONS

This application claims priority under 35 U.S.C. §119 to Korean Patent Application No. 10-2012-0104305, filed on Sep. 20, 2012, in the Korean Intellectual Property Office, the disclosure of which is incorporated herein by reference in its entirety.

TECHNICAL FIELD

The following disclosure relates to a magnetic device using permanent magnets, and more particularly, to a magnetic device using permanent magnets capable of forming a high magnetic field.

BACKGROUND

A magnetic device forming a magnetic field has been used for various fields, in particular, has been used for a magnetization for a bulk and a thin film for study on physical properties of a magnetic material, and a protein single crystal growth for a magnetic field.

In this case, in order to supply a high magnetic field of thousands of Gauss or more, an electromagnet using a solenoid coil, a superconducting quantum interference device (SQUID) using a super conductor, and a permanent magnet, and the like, have been used.

A crystal generation device in a high magnetic field for efficiently generating a crystal by a superconducting magnet has been proposed in Japanese Patent Laid-Open Publication No. 2012-076963 (Laid-Open Publication Date Apr. 19, 2012).

However, the superconducting magnet is not suitable for a large single crystal growth. For this reason, in the case of the large single crystal growth, a device for satisfying a temperature condition for a crystal growth may be required and it may be difficult to use and additional device, and the like, that may help the single crystal growth.

Therefore, a need exists for a magnetic device forming a high magnetic field to increase efficiency, with a simple configuration for study on physical properties of various magnetic materials.

SUMMARY

An exemplary embodiment of the present invention is directed to providing a magnetic device using permanent magnets having a high magnetic force using a first permanent magnet having the same polarities in a height direction and a second permanent magnet disposed so that the same polarities of the first permanent magnet and the second permanent magnet face each other, thereby stably forming a magnetic field in a horizontal direction and a vertical direction over a wide area.

Further, an exemplary embodiment of the present invention is directed to providing a magnetic device using permanent magnets capable of performing various kinds of magnetic field application experiments by forming a plurality of space parts in a horizontal direction and a height direction.

In addition, an exemplary embodiment of the present invention is directed to providing a magnetic device using permanent magnets which can be used for a single crystal growth, generation of polarized neutrons, and the like, with high efficiency and easily manufactured with a simple configuration.

Also, an exemplary embodiment of the present invention is directed to providing a magnetic device using permanent magnets capable of forming a high magnetic field on a space part by forming a first support part with materials having good transmission performance of lines of magnetic force, reinforcing durability of a second support part, and keeping a magnetic field at a place at which the space part and the first support part are formed.

Moreover, an exemplary embodiment of the present invention is directed to providing a magnetic device using permanent magnets capable of being easily used by leading a sample storage part in or out from a space part between first support parts, in which the sample storage part has a limited leading-in depth by a side cover and a hollow part is formed on the side cover to be used at the time of drawing out the sample storage part.

In one general aspect, there is provided a magnetic device 1000 using permanent magnets, including: at least two first permanent magnets 100 that are spaced apart from each other in a horizontal direction and have the same polarities in a height direction; second permanent magnets 200 that are disposed at upper and lower portions of the first permanent magnet 100 so that the same polarities thereof face each other in a height direction; and a fixing member 300 that fixes the first permanent magnet 100 and the second permanent magnet 200.

The fixing member 300 may form a space part 500 between the first permanent magnets 100 in a horizontal direction.

The second permanent magnets 200 may be formed to have a size corresponding to each of the first permanent magnets 100.

The second permanent magnets 200 may be formed to have a size corresponding to each of the plurality of first permanent magnets 100 forming a single column.

The first permanent magnet 100 may be provided in plural in a vertical direction to form a column.

The second permanent magnets 200 may be formed to have a size corresponding to the plurality of first permanent magnets 100 forming a single column.

The second permanent magnets 200 may be formed to have a size corresponding to all of the plurality of first permanent magnets 100.

The first permanent magnet 100 having the same polarity in a height direction may be provided in plural times in a height direction, and the first permanent magnet 100 and the second permanent magnet 200 may be alternately disposed in a height direction.

The fixing member 300 may include: first support parts 310 that are spaced apart from each other by a predetermined distance in a horizontal direction and are provided with first seating parts 311 formed therein, the first seating parts 311 having the first permanent magnets 100; a second support part 320 that has a plate form supporting upper and lower portions of the plurality of first support parts 310 and has a second seating part 321 provided with the second permanent magnet 200 concavely formed on an outer surface thereof; a upper cover 330 and a lower cover 340 that support an upper portion of the top second support part 320 and a lower portion of the bottom support part; and a fastening member 400 that fastens the upper cover, the second support part 320, the first support part 310, and the lower cover.

The first support part 310 may be made of an Al or glass material.

The second support part 320 may be made of a Ni alloy or steel material.

A separate sample storage part 600 may be drawn in and drawn out from the space part 500.

The fixing member 300 may be fastened by the fastening member 400 and further include a side cover 350 supporting one of both sides in a vertical direction.

The side cover 350 may be provided with a hollow part 351 in which a predetermined region of a location corresponding to the space part 500 is hollowed.

BRIEF DESCRIPTION OF THE DRAWINGS

FIG. 13 is another perspective view illustrating the magnetic device using permanent magnets according to an exemplary embodiment of the present invention.

DETAILED DESCRIPTION OF EMBODIMENTS

Hereinafter, a magnetic device 1000 using permanent magnets according to an exemplary embodiment of the present invention having the aforementioned features will be described with reference to the accompanying drawings.

The magnetic device 1000 using permanent magnets according to the exemplary embodiment of the present invention is configured to include a first permanent magnet 100, a second permanent magnet 200, and a fixing member 300.

At least two first permanent magnets 100 are disposed to be spaced apart from each other in a horizontal direction and each first permanent magnet 100 is disposed to have the same polarity in a height direction.

That is, at least two first permanent magnets 100 are formed at the same height to be spaced apart from each other and lower surfaces thereof form the same surface.

In this case, the first permanent magnet 100 forms an N pole and an S pole in a height direction and all of the plurality of first permanent magnets 100 has the same polarity direction.

Figure 1:
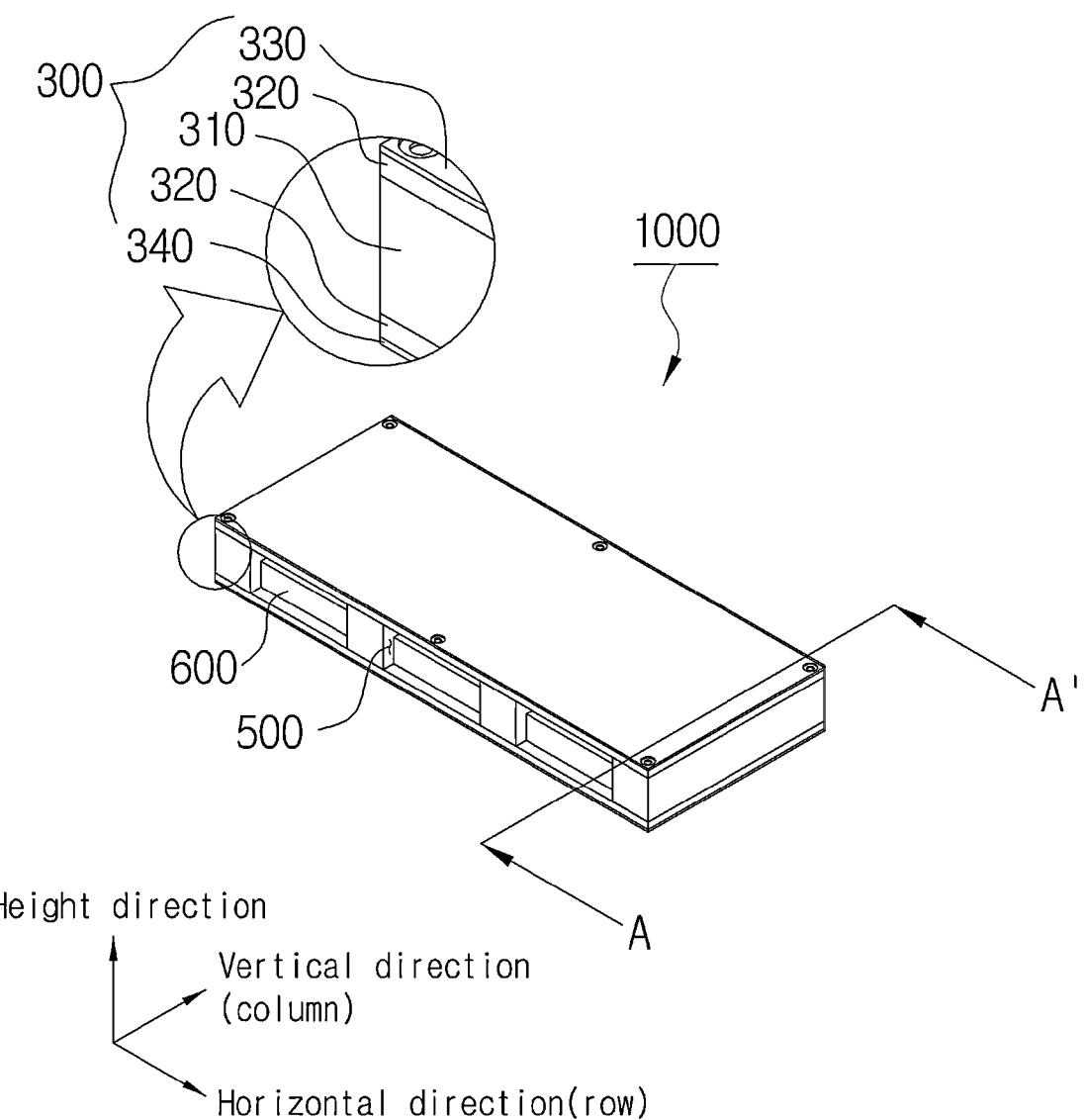
FIGS. 1 to 3 each are a perspective view, an exploded perspective view, and a cross-sectional view illustrating a magnetic device using permanent magnets according to an exemplary embodiment of the present invention.
Figure 2:
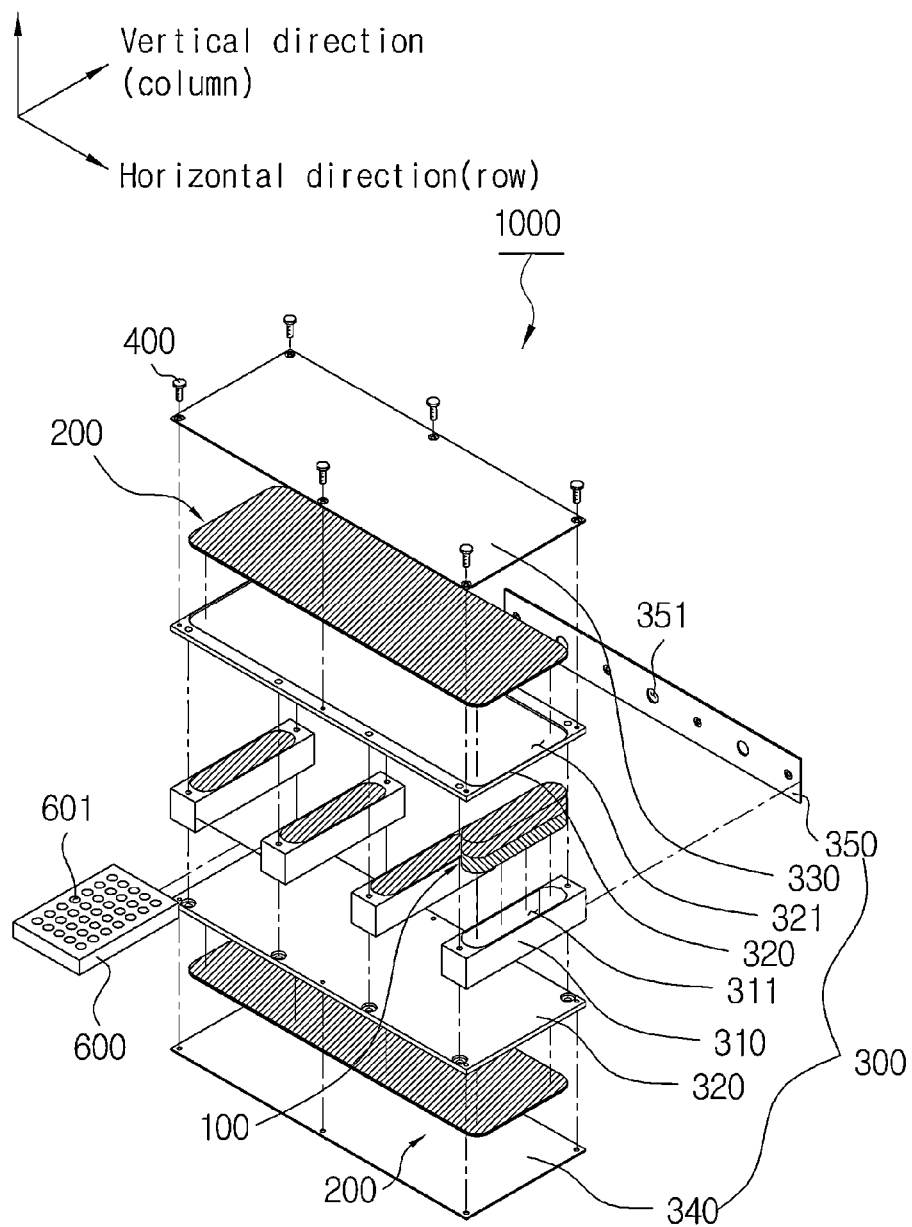

FIG. 2 illustrates an example in which the first permanent magnet 100 is formed in an oval shape and is integrally formed in a vertical direction (column).

The first permanent magnet 100 may be formed to have a section in any one of a circle, an oval, and a polygon and a size of thereof in horizontal, vertical, and height directions, and the like may be more variously formed in addition to the exampled illustrated in the accompanying drawings.

The second permanent magnets 200 are disposed at upper and lower portions of the first permanent magnet 100 so that the same polarities face each other in a height direction.

When the first permanent magnet 100 forms an N pole and an S pole from the top to the bottom in a height direction, the second permanent magnet 200 disposed at the upper and lower portions of the first permanent magnet 100 forms an S pole and an N pole downwardly from the upper portion of the height direction.

Figure 3:
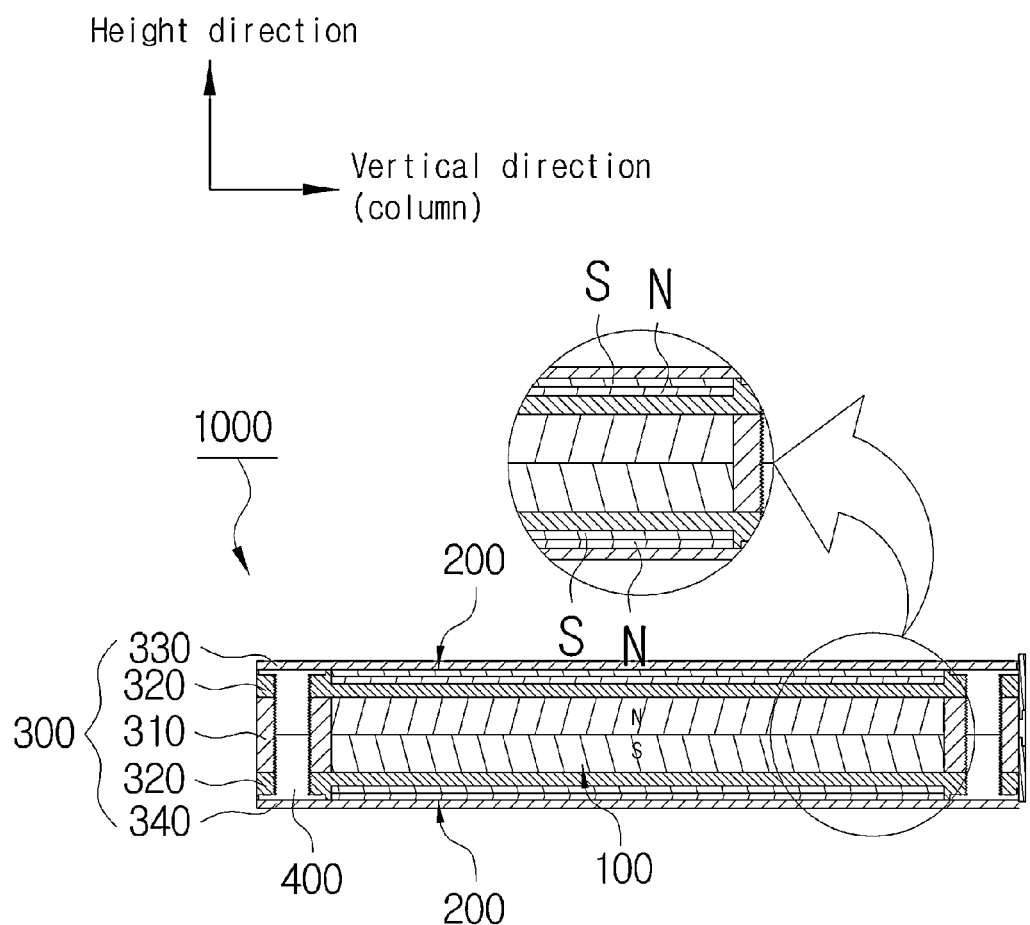
Figure 4:
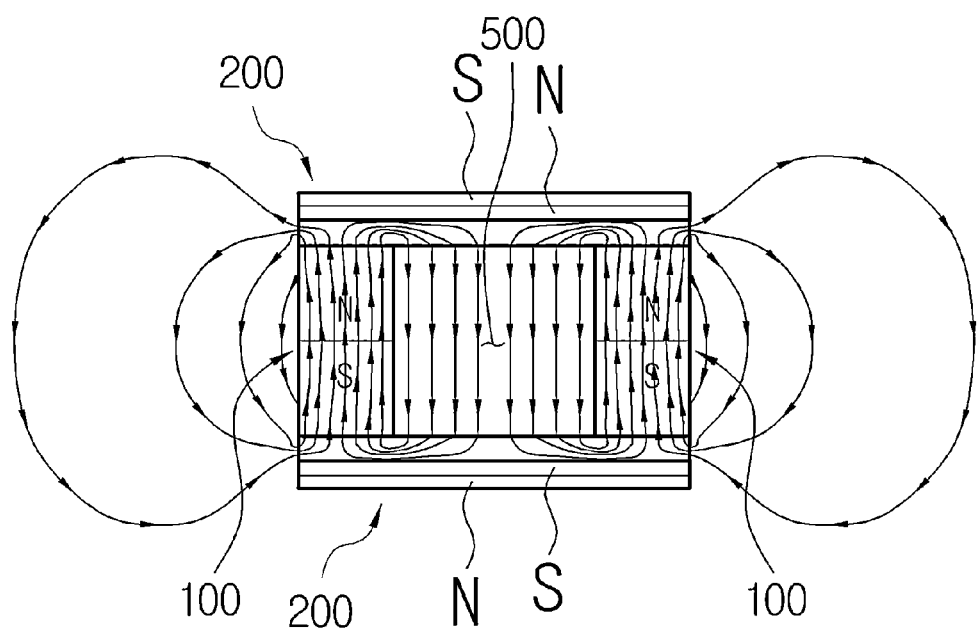
FIG. 4 is a diagram illustrating lines of magnetic force of the magnetic device using permanent magnets according to an exemplary embodiment of the present invention illustrated in FIG. 1.

The magnetic device 1000 using permanent magnets according to the exemplary embodiment of the present invention is not illustrated in the drawings, but when polarity directions illustrated in FIGS. 3 and 4 may be opposite to each other. In this case, in more detail, when the first permanent magnet 100 forms an S pole and an N pole from the top to the bottom in a height direction, the second permanent magnet 200 located at the upper and lower portions of the first permanent magnet 100 forms an N pole and an S pole from the top to the bottom in a height direction.

The fixing member 300 is a member for fixing the first permanent magnet 100 and the second permanent magnet 200 and a space part 500 is formed (in a spaced space) between the first permanent magnets 100 in a horizontal direction.

The space part 500 is a portion at which the lines of magnetic force are densified and a portion that a member applied with a magnetic field is located.

The description of the fixing member 300 will be described below.

In this case, the second permanent magnet 200 may be formed to correspond to the overall size of the plurality of first permanent magnets 100 forming the column.

FIG. 4 is a diagram illustrating the lines of magnetic force applied to the single space part 500 of the magnetic device 1000 using permanent magnets and illustrates an example in which the second permanent magnet 200 is formed at a size corresponding to the first permanent magnet 100 forming a column and a row.

Referring to FIG. 4, it can be appreciated that the magnetic device 1000 using permanent magnets according to the exemplary embodiment of the present invention concentrates the lines of magnetic force on the space part 500 to form a high magnetic field.

Figure 5:
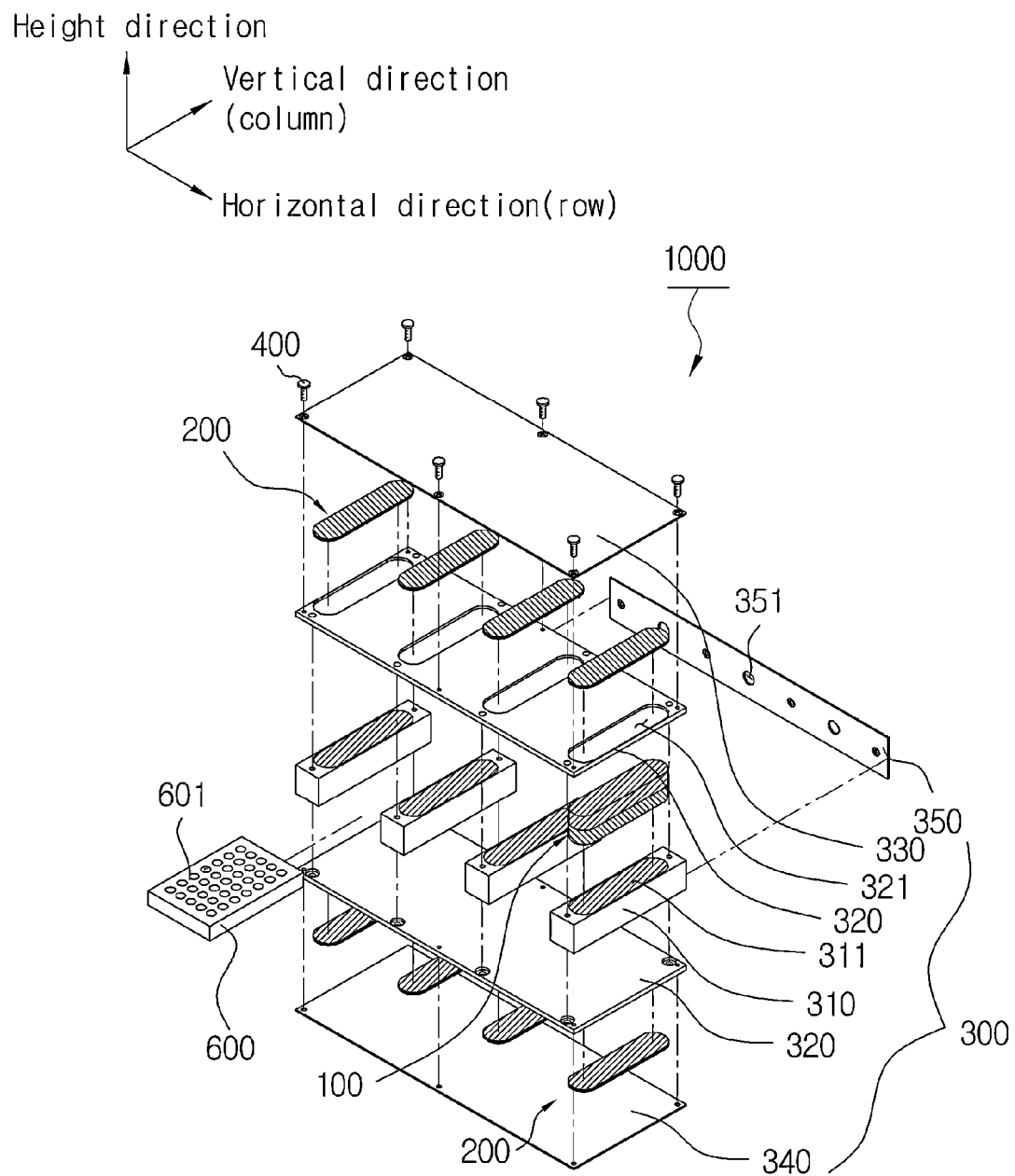
FIG. 5 is another perspective view illustrating the magnetic device using permanent magnets according to an exemplary embodiment of the present invention.

The magnetic device 1000 using permanent magnets according to the exemplary embodiment of the present invention illustrated in FIG. 5 is similar to the form illustrated in FIGS. 2 and 3 and illustrates an example in which the second permanent magnet 200 is formed at a size corresponding to the first permanent magnet 100 forming a column.

Figure 6:
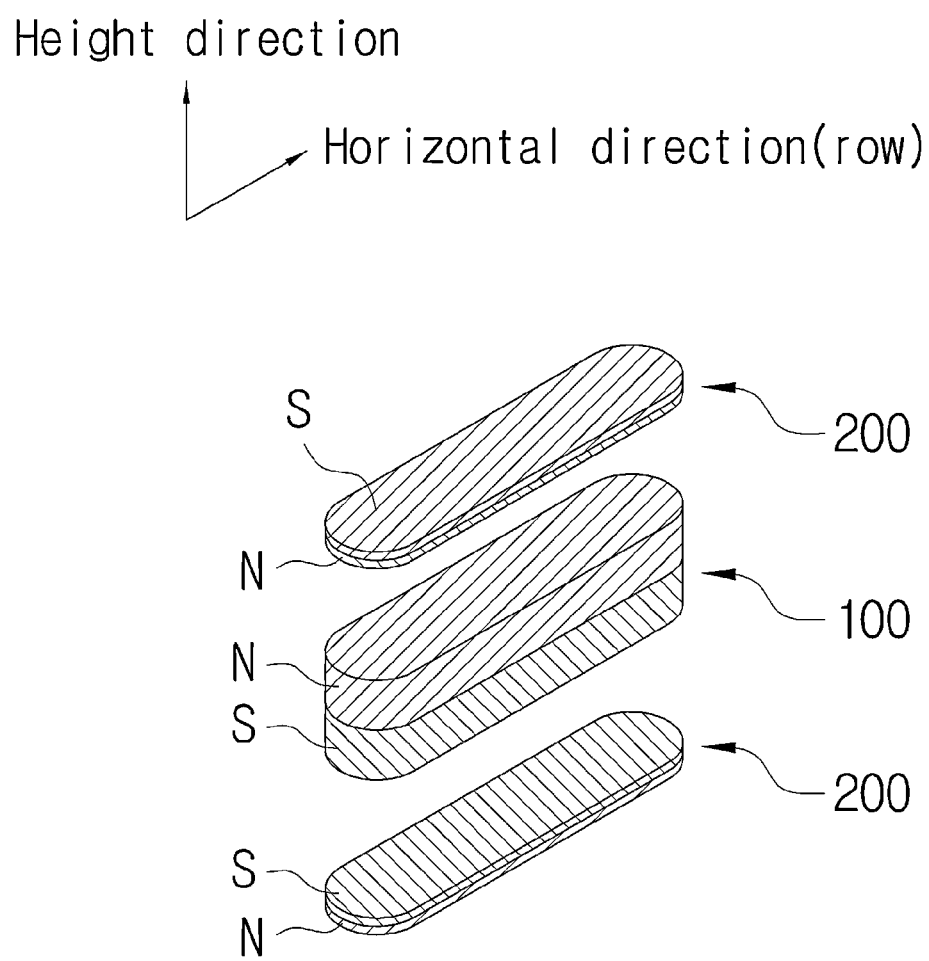
FIG. 6 is a diagram illustrating a disposition of a first permanent magnet and a second permanent magnet that act as a single space part of the magnetic device using permanent magnets according to an exemplary embodiment of the present invention illustrated in FIG. 5.
Figure 7A:
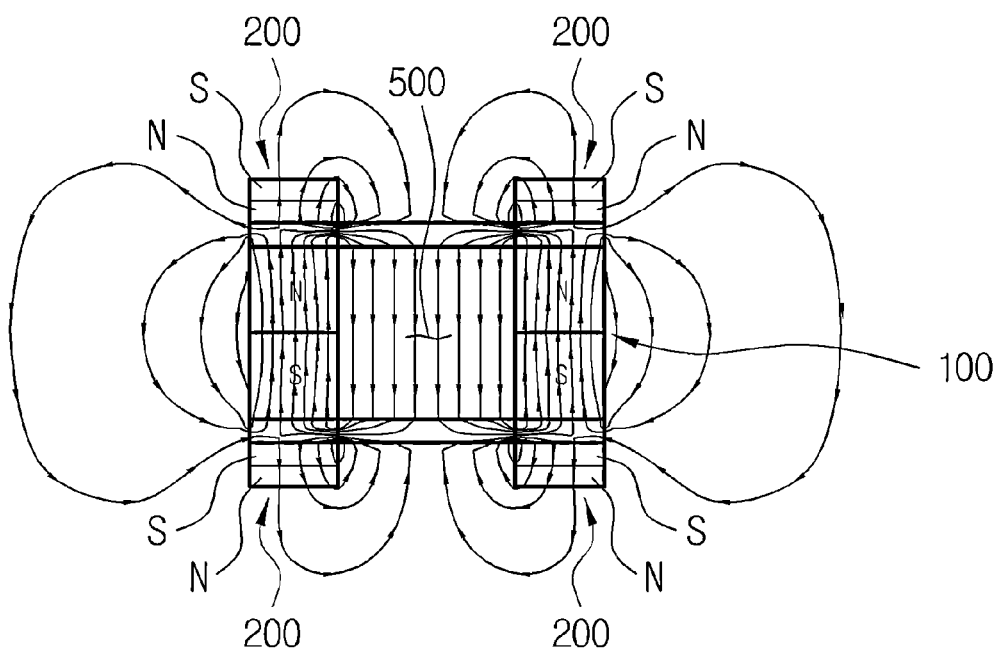
FIGS. 7A and 7B are diagrams illustrating lines of magnetic force of the magnetic device using permanent magnets according to an exemplary embodiment of the present invention illustrated in FIG. 5 and Comparative Example 1.
Figure 7B:
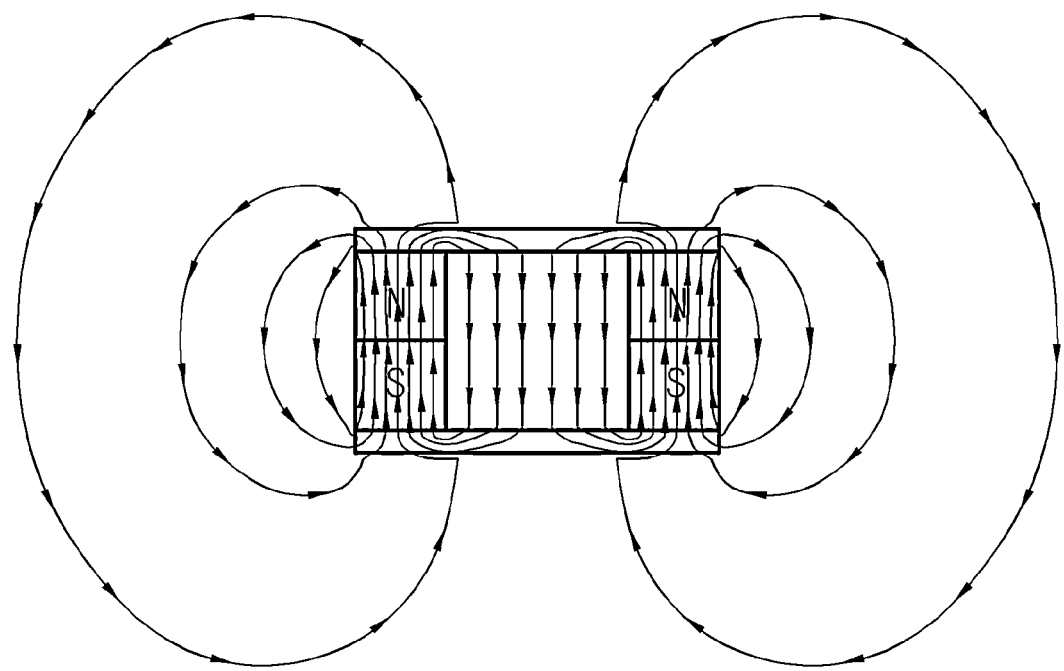

In addition, FIG. 6 is a diagram illustrating a disposition of the first permanent magnet 100 and the second permanent magnet 200 applied to the single space part 500 of the magnetic device 1000 using permanent magnets according to the exemplary embodiment of the present invention illustrated in FIG. 5 and FIGS. 7A and 7B are diagrams illustrating the lines of magnetic force of the magnetic device 1000 using permanent magnets according to the exemplary embodiment of the present invention illustrated in FIG. 5 and Comparative Example 1.

In more detail, FIG. 7A is a diagram illustrating the line of magnetic force depending on the disposition of the first permanent magnet 100 and the second permanent magnet 200 of the magnetic device 1000 using permanent magnets according to the exemplary embodiment of the present invention illustrated in FIG. 5 and FIG. 7B illustrates the line of magnetic force of Comparative Example 1 in which only the first permanent magnet 100 is spaced.

Figure 8:
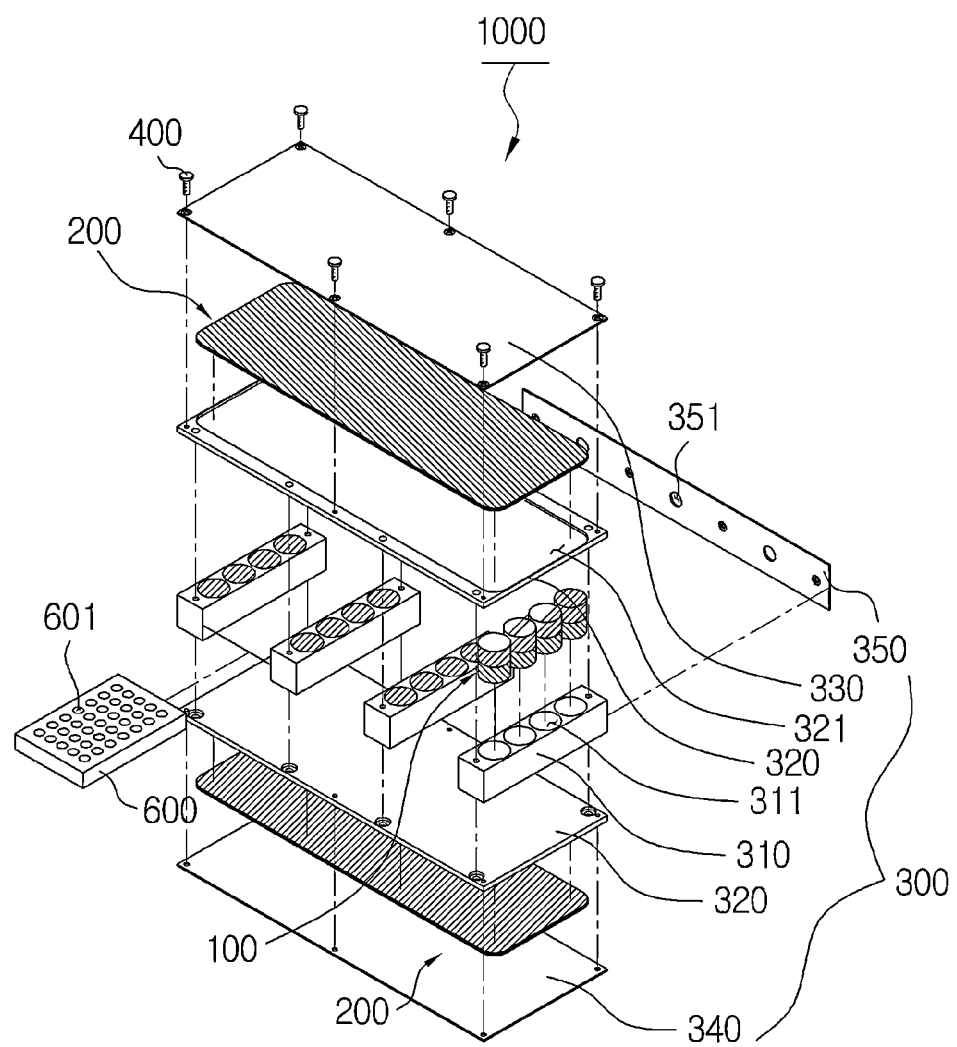
FIG. 8 is another perspective view illustrating the magnetic device using permanent magnets according to an exemplary embodiment of the present invention.

In addition, FIG. 8 is a diagram illustrating another example of the magnetic device 1000 using permanent magnets according to the exemplary embodiment of the present invention, which is similar to the form illustrated in FIGS. 2 and 3 but the first permanent magnets 100 may be disposed in plural in a vertical direction to form a column.

That is, as illustrated in FIG. 8, in the magnetic device 1000 using permanent magnets according to the exemplary embodiment of the present invention, the first permanent magnet 100 may be disposed in plural in a vertical direction so that a space of the space part 500 may extend in a vertical direction.

Figure 9:
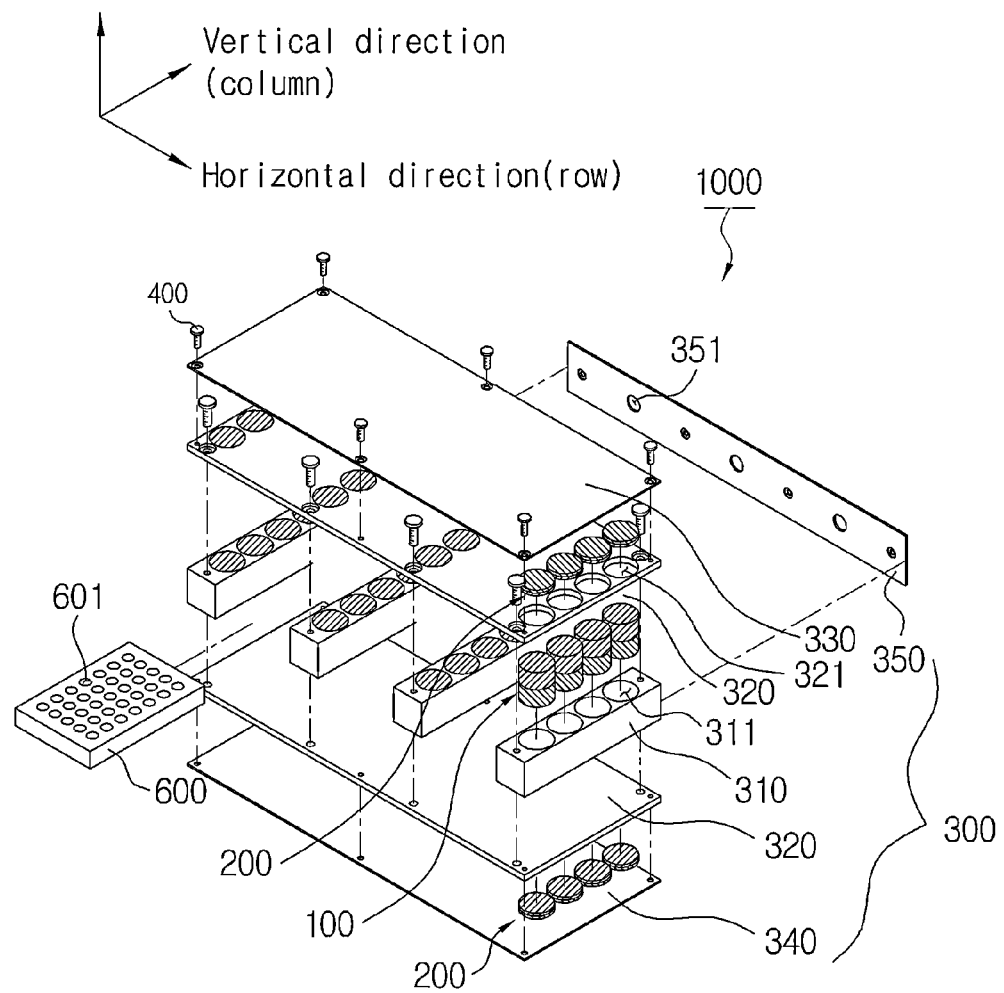
FIGS. 9 and 10 are another exploded perspective view and a cross-sectional view illustrating the magnetic device using permanent magnets according to an exemplary embodiment of the present invention.
Figure 10:
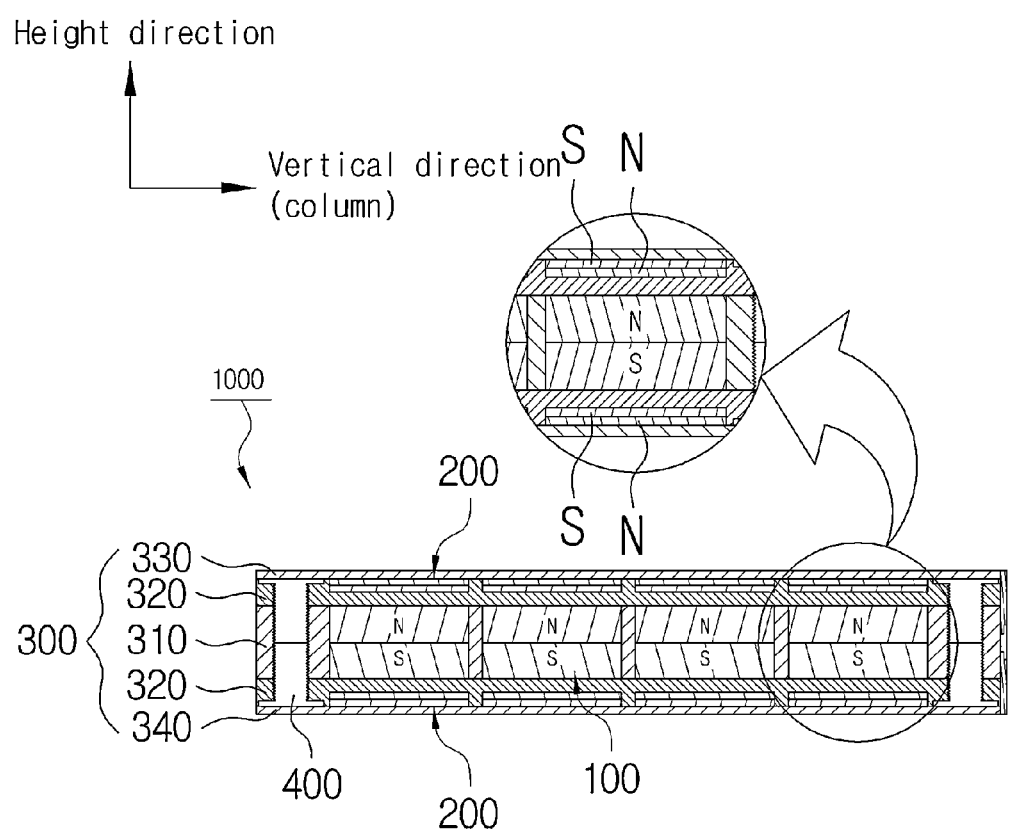

Further, FIGS. 9 and 10 are diagrams illustrating another example of the magnetic device 1000 using permanent magnets according to the exemplary embodiment of the present invention and illustrates an example in which four first permanent magnets 100 are disposed in a cylindrical shape in a vertical direction and the second permanent magnets 200 are each formed in a circular section shape corresponding to the first permanent magnets 100.

In the exemplary embodiment of the present invention, a size corresponding to each of the first permanent magnets 100 means a section (surface including a horizontal direction and a vertical direction) of the first permanent magnet 100 and the second permanent magnet 200 has a polarity in a height direction and a size thereof may be formed at a size corresponding to each of the first permanent magnets 100.

When the magnetic device 1000 using permanent magnets according to the exemplary embodiment of the present invention has a form and a disposition in which the first permanent magnet 100 and the second permanent magnet 200 are disposed so that the same polarities of the first permanent magnet 100 and the second permanent magnet face each other, the magnetic device 1000 using permanent magnets has more various shapes in addition to the foregoing example and may be formed in various number in a horizontal direction and a vertical direction.

Further, in the magnetic device 1000 using permanent magnets according to the exemplary embodiment of the present invention, in order to increase the formation number of space parts 500 in which lines of magnetic force are concentrated by the first permanent magnet 100 and the second permanent magnet 200, the first permanent magnet 100 having the same polarity in a height direction is disposed in plural times in a height direction and the first permanent magnet 100 and the second permanent magnet 200 may be alternately disposed in a height direction.

That is, when a single space part 500 is formed in a height direction, the second permanent magnet 200—the first permanent magnet 100—the second permanent magnet 200 are disposed and when two space parts 500 are formed in a height direction, the second permanent magnet 200—the first permanent magnet 100—the second permanent magnet 100—the first permanent magnet 100—the second permanent magnet 200 are disposed.

Figure 11:
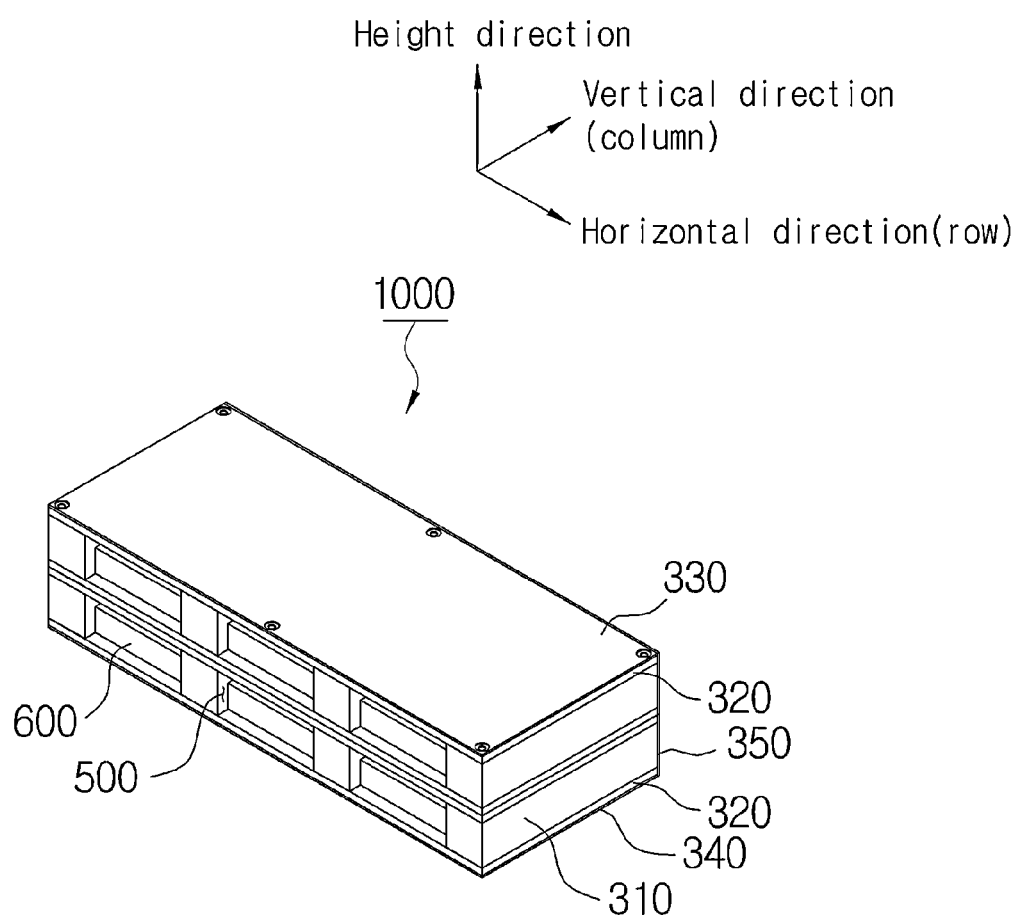
FIG. 11 is another perspective view illustrating the magnetic device using permanent magnets according to an exemplary embodiment of the present invention.

FIG. 11 illustrates an example in which in the magnetic device 1000 using permanent magnets according to the exemplary embodiment of the present invention, a total six of space parts 500, that is, three space parts 500 in a horizontal direction and two space parts 500 in a height direction are formed.

Figure 12A:
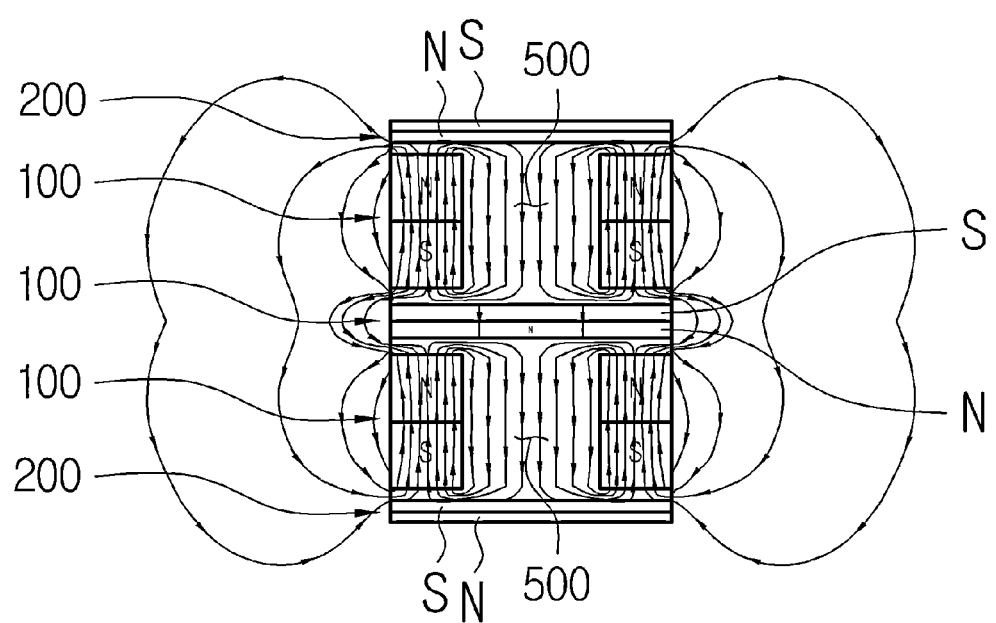
FIGS. 12A and 12B are diagrams illustrating lines of magnetic force of the magnetic device using permanent magnets according to an exemplary embodiment of the present invention illustrated in FIG. 11 and Comparative Example 2.
Figure 12B:
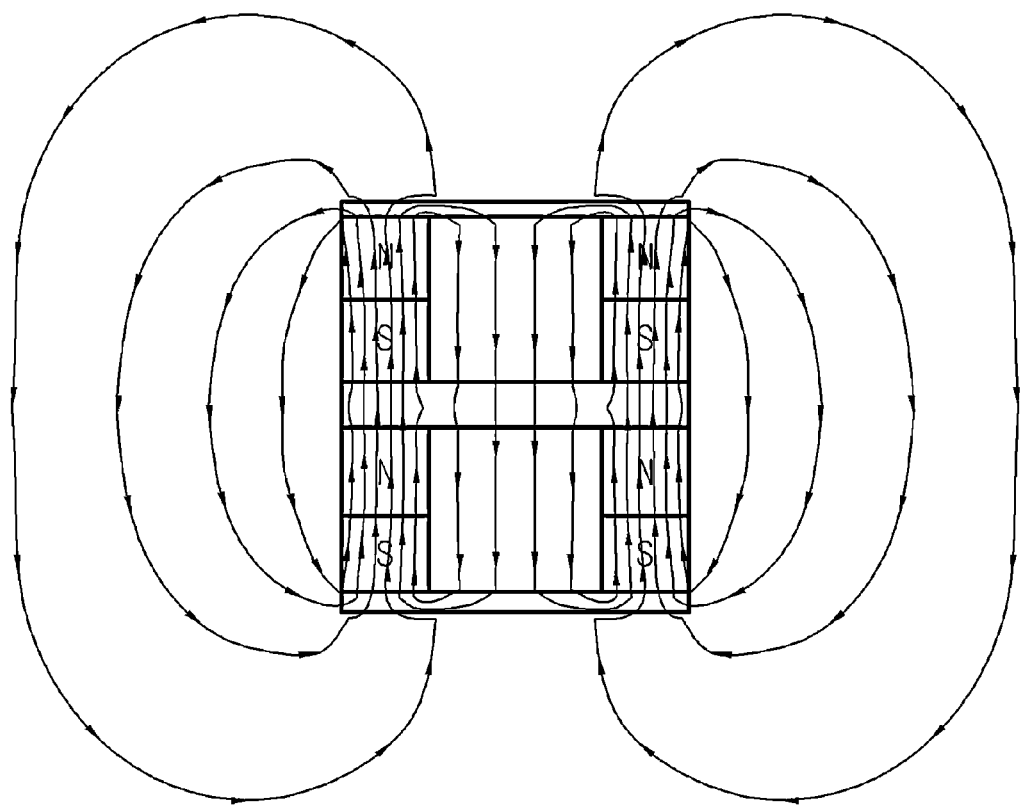

FIG. 12A is a diagram illustrating lines of magnetic force applied on the single space part 500 of the magnetic device 1000 using permanent magnets illustrated in FIG. 11 and FIG. 12B is a diagram illustrating lines of magnetic force when only the first permanent magnet 100 of FIG. 12A is disposed.

As compared with FIG. 12B, it can be appreciated from FIG. 12A that more dense lines of magnetic force are formed on the space part 500 to form a high magnetic field.

In this case, the first permanent magnet 100 and the second permanent magnet 200 that are disposed at the same height may be formed to have various forms.

The fixing member 300 is a member to stably support the first permanent magnet 100 and the second permanent magnet 200 and may be formed to include a first support part 310, a second support part 320, an upper cover, a lower cover, and a fastening member 400.

The first support part 310 is spaced by a predetermined distance in a horizontal direction and is provided with a first hollow part 351 having the first permanent magnet 100 formed therein.

The first support part 310 may be seated with the first permanent magnet 100 and may be made of a material that stably forms the space part 500 and has good transmission performance of lines of magnetic force.

An example of a material forming the first support part 310 may include Al and glass.

In this case, in the present invention, Al is collectively defined aluminum metal and an alloy including the aluminum metal.

The second support part 320 supports the upper and lower portions of the first support part 310 to fix the first permanent magnet 100 and an outer surface thereof is concavely provided with a second seating part 321 provided with the second permanent magnet 200.

The second support part 320 may be formed in a plate shape having a size corresponding to the overall size of the at least two first support parts 310 in consideration of fastening easiness.

In this case, the outer surface of the second support part 320 means an opposite side to a surface contacting the first permanent magnet 100, in both surfaces having a plate form.

The second support part 320 is provided with the second seating part 321 to include the second permanent magnet 200 and may be fixed to the first support part 310 by the fastening member 400.

In addition, the second support part 320 may be made of a material that may secure a sufficient durability and may be made of a material that may keep a magnetic field at an inner side at which the space part 500 and the first support part 310 are formed.

An example of a material forming the second support part 320 may include a Ni alloy or steel material.

The upper cover 330 and the lower cover 340 are each configured to support the upper portion of the top second support part 320 and the lower portion of the bottom second support part 320.

The upper cover 330 has a plate shape that supports the upper portion of the second support part 320 and is fastened with the second support part 320 to fix the second permanent magnet 200.

The lower cover 340 has a plate shape that supports the lower portion of the lower second support part 320 and is fastened with the second support part 320 to fix the second permanent magnet 200.

In this case, the fastening of the first support part 310 and the second support part 320, the fastening of the upper cover 330 and the second support part 320, and the fastening of the lower cover 340 and the second support part 320 may be performed by the fastening member 400 and the drawing illustrates the form in which the target to be fastened is provided with a screw thread and a bolt is used.

The magnetic device 1000 using permanent magnets according to the exemplary embodiment of the present invention is not limited thereto and the number and form of fastening members 400 may be more variously formed.

That is, in the magnetic device 1000 using permanent magnets according to the exemplary embodiment of the present invention, the space part 500 is formed in a horizontal direction by the first support part 310 and in a height direction by the second support part 320.

The space part 500 is a portion at which the lines of magnetic force are densified and may be inserted with the sample storage part 600 in which a sample is stored.

FIGS. 2, 5, and 8 illustrate that the sample storage part 600 is formed in a flat rectangular parallelepiped shape and a plurality of concave parts 601 are formed.

The sample storage part 600 is formed of a material transmitting a magnetic field and the magnetic device 1000 using permanent magnets according to the exemplary embodiment of the present invention may be more variously formed, like a form in which a sample that is a target irradiated with a magnetic field is stored.

In this case, the fixing member 300 may further provided with a side cover 350 supporting one of both sides in a vertical direction so that an insertion depth of the sample storage part 600 in a vertical direction may be limited.

Further, the side cover 350 may be provided with a hollow part 351 in which a predetermined region of a location corresponding to the space part 500 is hollowed.

The hollow part 351 may be used as a portion for drawing out the sample storage part 600 drawing in the space part 500 using a separate bar, and the like.

Meanwhile, in the magnetic device 1000 using permanent magnets according to the exemplary embodiment of the present invention, the upper cover 330—the second support part 320—the first support part 310—the second support part 320—the lower cover 340 are disposed from the top to the bottom in a height direction and when the plurality of space parts 500 are formed in a height direction, the second support part 320—the first support part 310—the second support part 320 may be provided as many as a frequency corresponding to the formation number of space parts 500 between the upper cover 330 and the lower cover 340.

Therefore, the magnetic device 1000 using the permanent magnet of the present invention has the high magnetic force using the first permanent magnet 100 having the same polarities in the height direction and the second permanent magnet 200 disposed so that the same polarities of the first permanent magnet 100 and the second permanent magnet face each other, thereby stably forming the magnetic field in a horizontal direction and a vertical direction over the wide area.

Further, the magnetic device 1000 using permanent magnets can perform various kinds of magnetic field application experiments, in particular, various experiments including the protein single crystal growth and the generation of polarized neutrons by forming the plurality of space parts 500 in the horizontal direction and the height direction.

FIGS. 14 and 15 illustrate execution photographs of the magnetic device 1000 using permanent magnets according to the exemplary embodiment of the present invention and FIGS. 14 and 15 each illustrate the state in three days and in fourteen days after chloride of manganese $MnCl_2$ that is a pamamagnetic material affected by a magnetic field is added to a lysozyme protein aqueous solution.

Figure 14A:
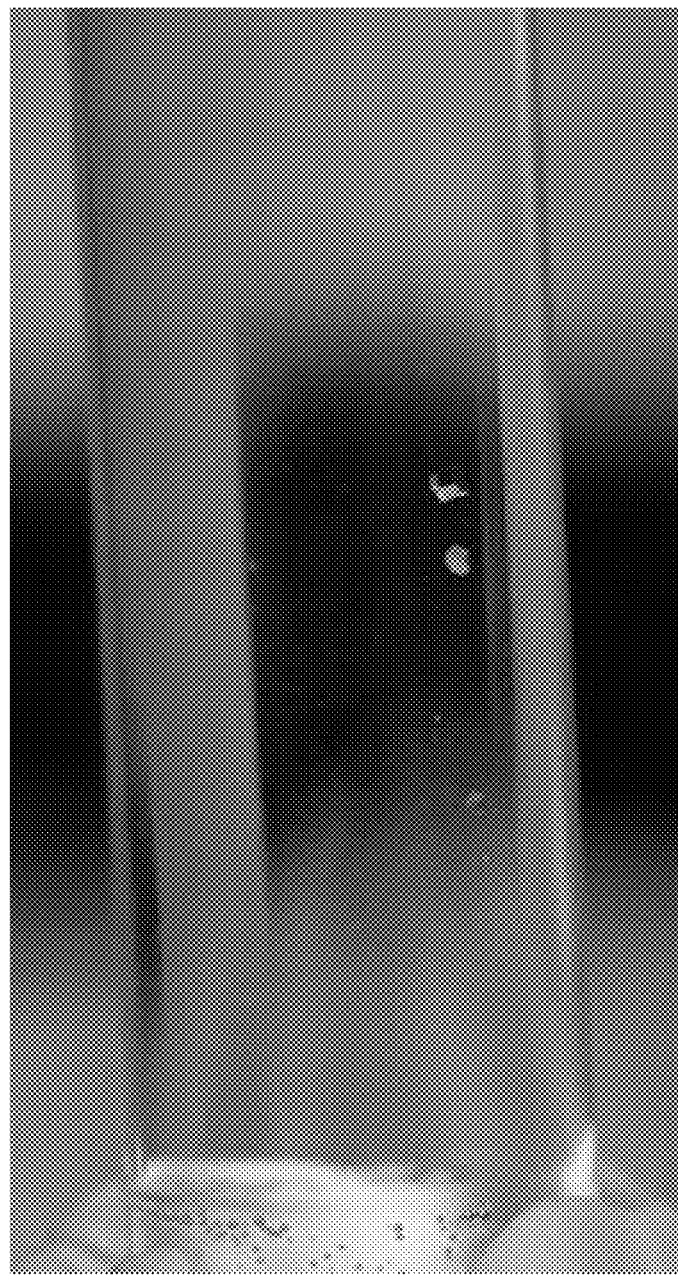
FIGS. 14A and 15A are execution photographs of the magnetic device using permanent magnets according to an exemplary embodiment of the present invention and FIGS. 14B and 15B are execution photographs of Comparative Example.
Figure 14B:
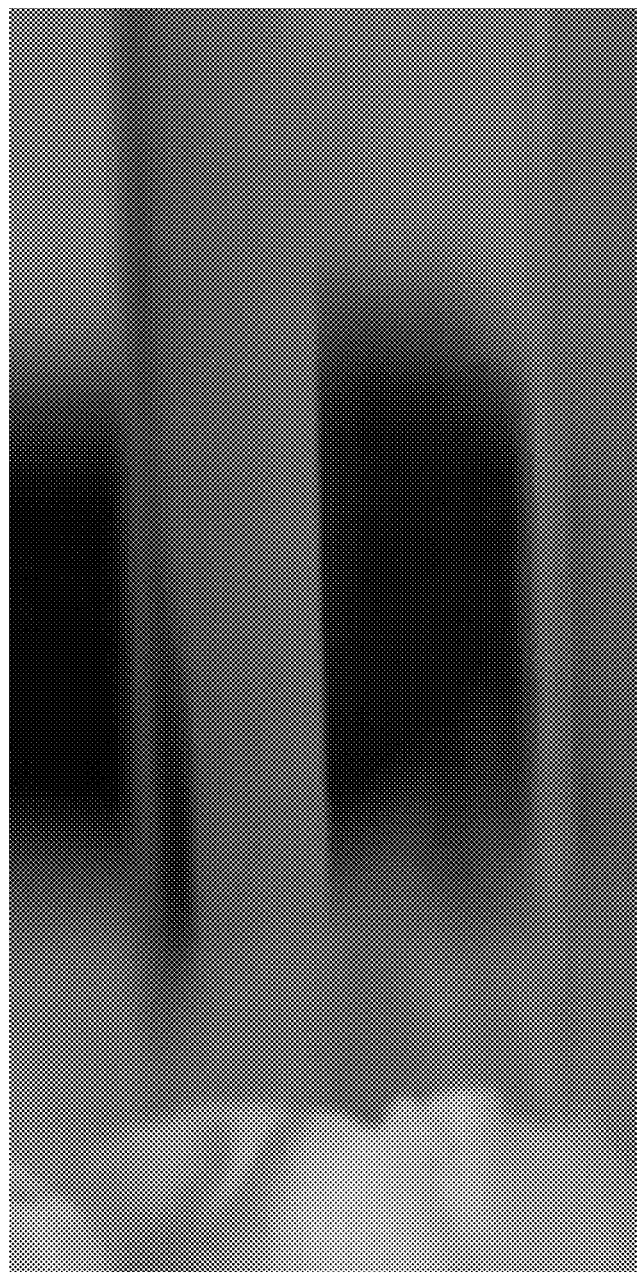
Figure 15A:
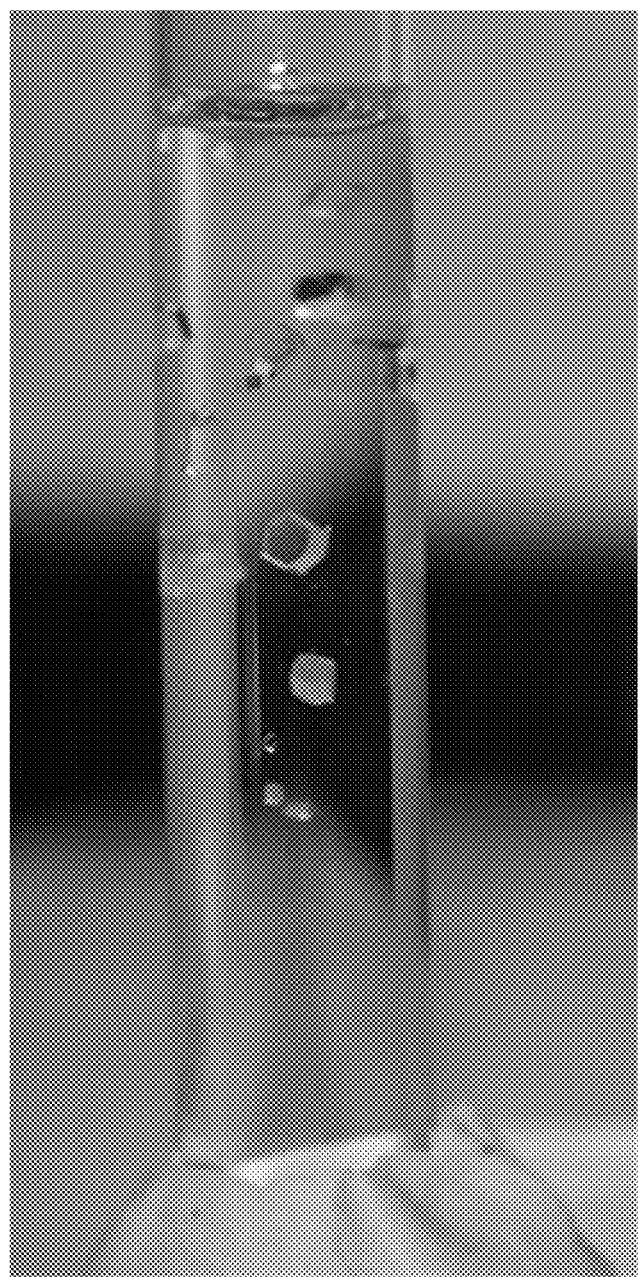

In this case, FIGS. 14 and 15A are photographs in the case of using the magnetic device 1000 using permanent magnets illustrated in FIGS. 1 to 3 and FIGS. 14B and 15B are photographs in the case of not using the magnetic device 1000 using permanent magnets.

Comparing with FIG. 14B, in the magnetic device 1000 using permanent magnets according to the exemplary embodiment of the present invention, the crystallization is rapidly progressed in FIG. 14A, such that it can be confirmed that a crystal has a size of 0.5 mm or more.

Figure 15B:
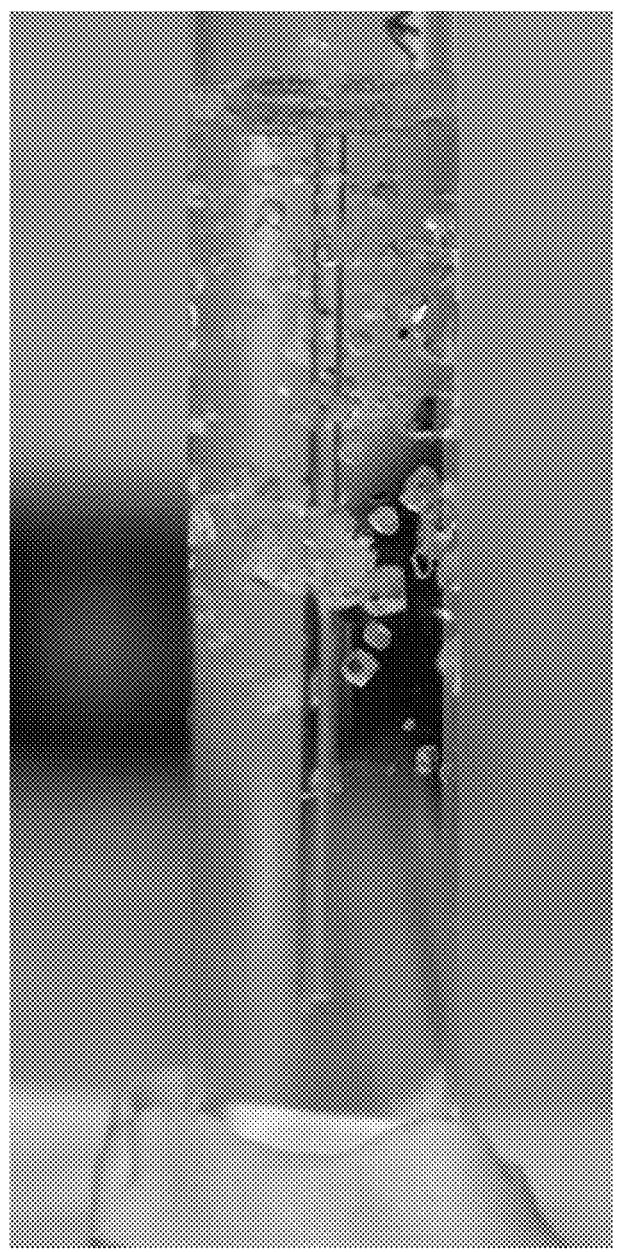

In the magnetic device 1000 using permanent magnets according to the exemplary embodiment of the present invention, in FIG. 15A, it can be confirmed that the crystal growth is performed in earnest and grown 3 mm or more, but in FIG. 15B, it can be confirmed that the crystals are not largely grown due to the interference and the crystal having a size of about 0.5 to 1 mm are formed, some of the crystals are adhered to each other.

That is, the magnetic device 1000 using permanent magnets according to the exemplary embodiment of the present invention can form the high magnetic field using the permanent magnets 100 and 200.

Therefore, the magnetic device using the permanent magnet of the present invention has the high magnetic force using the first permanent magnet having the same polarities in the height direction and a second permanent magnet disposed so that the same polarities of the first permanent magnet and the second permanent magnet face each other, thereby stably forming the magnetic field in a horizontal direction and a vertical direction over the wide area.

Further, the magnetic device using the permanent magnets of the present invention can perform various kinds of magnetic field application experiments by forming the plurality of space parts in a horizontal direction and a height direction.

In addition, the magnetic device using the permanent magnets of the present invention can be used for the single crystal growth, the generation of polarized neutrons, and the like, with high efficiency and easily manufactured with the simple configuration.

Also, the magnetic device using the permanent magnets capable of forming the high magnetic field on a space part by forming the first support part with materials having the good transmission performance of lines of magnetic force, reinforcing the durability of the second support part, and keeping a magnetic field at a place at which the space part and the first support part are formed.

The magnetic device using the permanent magnets of the present invention can easily used by leading the sample storage part in or out from the space part between the first support parts, in which the sample storage part has the limited leading-in depth by the side cover and the hollow part is formed on the side cover to be used at the time of drawing out the sample storage part.

The present invention is not limited to the above-mentioned exemplary embodiments, and may be variously applied, and may be variously modified without departing from the gist of the present invention claimed in the claims.

What is claimed is:

1. A magnetic device using permanent magnets, comprising:
    at least two first permanent magnets (100) that are spaced apart from each other in a horizontal direction and have the same polarities in a height direction;
    second permanent magnets (200) that are disposed at upper and lower portions of the first permanent magnets (100) so that the same polarities thereof face each other in a height direction; and
    a fixing member (300) that fixes the first permanent magnets (100) and the second permanent magnets (200),
    wherein the fixing member (300) includes:
    first support parts (310) that are spaced from each other by a predetermined distance in a horizontal direction and are provided with first seating parts (311) formed therein, the first seating parts (311) having the first permanent magnets (100);
    a second support part (320) that has a plate form supporting upper and lower portions of the plurality of first support parts (310) and has a second seating part (321) provided with the second permanent magnets (200) concavely formed on an outer surface thereof;
    an upper cover (330) and a lower cover (340) that support an upper portion of the top second support part (320) and a lower portion of the bottom support part; and
    a fastening member (400) that fastens the upper cover, the second support part (320), the first support part (310), and the lower cover.

2. The magnetic device using permanent magnets of claim 1, wherein the fixing member (300) forms a space part (500) between the first permanent magnets (100) in a horizontal direction.

3. The magnetic device using permanent magnets of claim 2, wherein the second permanent magnets (200) are formed to have a size corresponding to each of the first permanent magnets (100).

4. The magnetic device using permanent magnets of claim 2, wherein the second permanent magnets (200) are formed to have a size corresponding to each of the plurality of first permanent magnets (100) forming a single column.

5. The magnetic device using permanent magnets of claim 2, wherein the first permanent magnets (100) are provided in plural in a vertical direction to form a column.

6. The magnetic device using permanent magnets of claim 5, wherein the second permanent magnets (200) are formed to have a size corresponding to the plurality of first permanent magnets (100) forming a single column.

7. The magnetic device using permanent magnets of claim 5, wherein the second permanent magnets (200) are formed to have a size corresponding to all of the plurality of first permanent magnets (100).

8. The magnetic device using permanent magnets of claim 2, wherein the first permanent magnets (100) having the same polarity in a height direction is provided in plural times in a height direction, and
    the first permanent magnets (100) and the second permanent magnets (200) are alternately disposed in a height direction.

9. The magnetic device using permanent magnets of claim 1, wherein the first support part (310) is made of an Al or glass material.

10. The magnetic device using permanent magnets of claim 1, wherein the second support part (320) is made of a Ni alloy or steel material.

11. The magnetic device using permanent magnets of claim 1, wherein a separate sample storage part (600) is drawn in and drawn out from the space part (500).

12. The magnetic device using permanent magnets of claim 11, wherein the fixing member (300) is fastened by the fastening member (400) and further includes a side cover (350) supporting one of both sides in a vertical direction.

13. The magnetic device using permanent magnets of claim 12, wherein the side cover (350) is provided with a hollow part (351) in which a predetermined region of a location corresponding to the space part (500) is hollowed.

* * * * *